(12) United States Patent
Chen et al.

(10) Patent No.: US 12,513,963 B2
(45) Date of Patent: Dec. 30, 2025

(54) BIDIRECTIONAL SWITCHING DEVICES, ITS TERMINAL STRUCTURES, AND ELECTRONIC DEVICES

(71) Applicant: Silergy Semiconductor Technology (Hangzhou) LTD, Hangzhou (CN)

(72) Inventors: Nan Chen, Hangzhou (CN); Yicheng Du, Hangzhou (CN); Pengfei Yin, Hangzhou (CN); Meng Wang, Hangzhou (CN); Kai Zhang, Hangzhou (CN); Hao Zhu, Hangzhou (CN); Xi Zhou, Hangzhou (CN); Yunjiao He, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 382 days.

(21) Appl. No.: 18/213,952

(22) Filed: Jun. 26, 2023

(65) Prior Publication Data
US 2024/0014274 A1 Jan. 11, 2024

(30) Foreign Application Priority Data
Jul. 5, 2022 (CN) .......................... 202210789388.2

(51) Int. Cl.
| | | |
|---|---|---|
| *H10D 64/00* | (2025.01) | |
| *H10D 30/01* | (2025.01) | |
| *H10D 30/65* | (2025.01) | |
| *H10D 62/17* | (2025.01) | |

(52) U.S. Cl.
CPC ....... *H10D 64/112* (2025.01); *H10D 30/0281* (2025.01); *H10D 30/65* (2025.01); *H10D 62/393* (2025.01)

(58) Field of Classification Search
CPC ................ H10D 64/112; H10D 64/111; H10D 84/0126; H10D 84/038; H10D 84/83; H10D 30/0281; H10D 30/65; H10D 62/393; H10D 62/115; H10D 62/126
See application file for complete search history.

(56) References Cited

U.S. PATENT DOCUMENTS

| | | |
|---|---|---|
| 7,018,899 B2 | 3/2006 | Sung |
| 7,074,659 B2 | 7/2006 | Zuniga et al. |
| 7,230,302 B2 | 6/2007 | Lotfi et al. |
| 7,855,407 B2 | 12/2010 | Shim |
| 7,888,222 B2 | 2/2011 | You et al. |
| 7,981,739 B1 | 7/2011 | You et al. |
| 7,999,318 B2 | 8/2011 | Zuniga et al. |

(Continued)

FOREIGN PATENT DOCUMENTS

CN 110880500 B * 12/2001 ........... H10D 89/811

*Primary Examiner* — Mamadou L Diallo

(57) ABSTRACT

A terminal structure of a bidirectional switching device, where the terminal structure can include: a field plate located on a top surface of a well region and between a first voltage-withstand region and a second voltage-withstand region, where the bidirectional switching device comprises the well region, and the first and second voltage-withstand regions located in the well region; and where a potential is connected to the field plate, in order to decrease an electrical leakage of a parasitic transistor, where the parasitic transistor is formed by the first voltage-withstand region, the well region, and the second voltage-withstand region.

20 Claims, 7 Drawing Sheets

(56) References Cited

U.S. PATENT DOCUMENTS

| | | |
|---|---|---|
| 8,063,444 B2 | 11/2011 | Chang |
| 8,119,507 B2 | 2/2012 | You |
| 8,293,612 B2 | 10/2012 | Lee |
| 8,319,283 B2 | 11/2012 | Min et al. |
| 8,431,450 B1 | 4/2013 | Zuniga et al. |
| 8,455,340 B2 | 6/2013 | Zuniga et al. |
| 8,574,973 B1 | 11/2013 | You et al. |
| 8,581,344 B2 | 11/2013 | Liu |
| 8,716,790 B2 | 5/2014 | Lotfi et al. |
| 8,716,795 B2 | 5/2014 | You |
| 8,912,600 B2 | 12/2014 | You |
| 10,998,305 B2 | 5/2021 | Qiu et al. |
| 2002/0149067 A1* | 10/2002 | Mitros ................ H10D 62/378 257/E29.268 |
| 2009/0065810 A1* | 3/2009 | Honea ................ H10D 30/4755 257/192 |
| 2010/0052052 A1 | 3/2010 | Lotfi et al. |
| 2012/0223384 A1* | 9/2012 | Huang ................ H10D 30/603 257/E29.256 |
| 2014/0320174 A1 | 10/2014 | Lu et al. |
| 2019/0355844 A1* | 11/2019 | Sheridan ............ H10D 64/112 |
| 2020/0227545 A1* | 7/2020 | Then .................... H10D 64/411 |
| 2022/0157981 A1* | 5/2022 | Gupta ................ H10D 62/343 |
| 2022/0166425 A1 | 5/2022 | Lin et al. |
| 2023/0261040 A1* | 8/2023 | Schippel ............. H10D 89/611 257/49 |
| 2024/0055516 A1* | 2/2024 | Wang ................ H10D 62/116 |
| 2024/0355888 A1* | 10/2024 | Shiraishi ............ H10D 64/111 |

\* cited by examiner

BIDIRECTIONAL SWITCHING DEVICES, ITS TERMINAL STRUCTURES, AND ELECTRONIC DEVICES

RELATED APPLICATIONS

This application claims the benefit of Chinese Patent Application No. 202210789388.2, filed on Jul. 5, 2022, which is incorporated herein by reference in its entirety.

FIELD OF THE INVENTION

The present invention generally relates to semiconductor integrated circuit design and manufacturing, and more particularly to bidirectional switching devices, terminal structures of bidirectional switching devices, and electronic devices.

BACKGROUND

Voltage regulators, such as DC-to-DC voltage converters, are used to provide stable voltage sources for various electronic systems. Efficient DC-to-DC converters are particularly useful for battery management in low power devices (e.g., laptop notebooks, cellular phones, etc.). A switching voltage regulator can generate an output voltage by converting an input DC voltage into a high frequency voltage, and then filtering the high frequency input voltage to generate the output DC voltage. For example, the switching regulator can include a switch for alternately coupling and decoupling an input DC voltage source (e.g., a battery) to a load (e.g., an integrated circuit [IC], a light-emitting diode [LED], etc.). Lateral double-diffused metal oxide semiconductor (LDMOS) transistors may be utilized in switching regulators due to their performance in terms of a tradeoff between their specific on-resistance ($R_{dson}$) and drain-to-source breakdown voltage ($BV_{d\_s}$).

DETAILED DESCRIPTION

Figure 1:
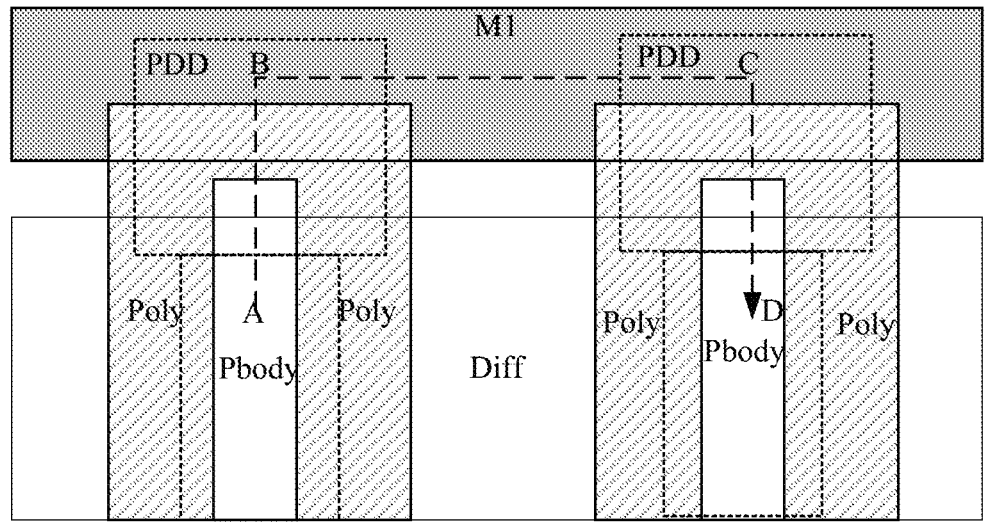
FIG. 1 is a layout diagram of an example bidirectional switching device.

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Further, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Semiconductor devices are generally manufactured using two complex manufacturing processes: front-end manufacturing and back-end manufacturing. Front-end manufacturing may involve the formation of a plurality of die on the surface of a semiconductor wafer. Each die on the wafer may contain active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components can be formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist may be removed, leaving behind a patterned layer. Alternatively, some types of materials can be patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface may be used to produce smaller and more densely packed active and passive components. Planarization can be used to remove material from the surface of the wafer and produce a uniformly flat surface. Planarization can involve polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer may be singulated using a laser cutting tool or saw blade. After singulation, the individual die are mounted to a package substrate that can include pins or contact pads for interconnection with other system components. Contact pads formed over the semiconductor die can then be connected to contact pads within the package. The electrical connections can be made with solder bumps, stud bumps, conductive paste, or wire bonds, as a few examples. An encapsulant or other molding material may be deposited over the package to provide physical support and electrical isolation. The finished package can then be inserted into an electrical system and the functionality of the semiconductor device is made available to the other system components.

Under existing processes, bidirectional switching devices with different bidirectional withstand voltages are typically formed by integrating two laterally diffused metal oxide semiconductor (LDMOS) devices with different withstand voltages. The device formed in this way may have the same structure as a single LDMOS device except that it shares a drain region. However, one problem of this structure is that there can be a parasitic transistor structure in the terminal region of the device, the voltages of the two sources can be different, and this parasitic structure can punch-through and cause a leakage phenomenon to occur, thus affecting device performance. In one approach to solving this problem, the pitch of the device can make the base region of the parasitic transistor wider, in order to prevent punching through and electrical leakage. However, this increases the device size, conduction resistance of the device, and chip area. Another approach is to reduce the width of the terminal doping region and increase the doping concentration of the base region of the parasitic transistor in the terminal region, but this can also affect the voltage withstand of the device terminal.

Figure 2:
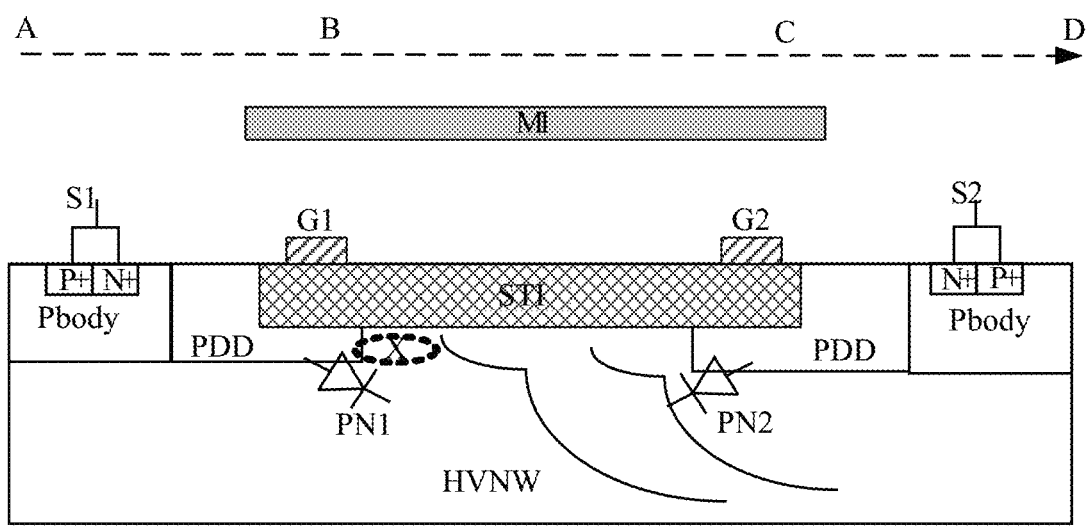
FIG. 2 is a first cross-sectional diagram at A-B-C-D of the example of FIG. 1.
Figure 3:
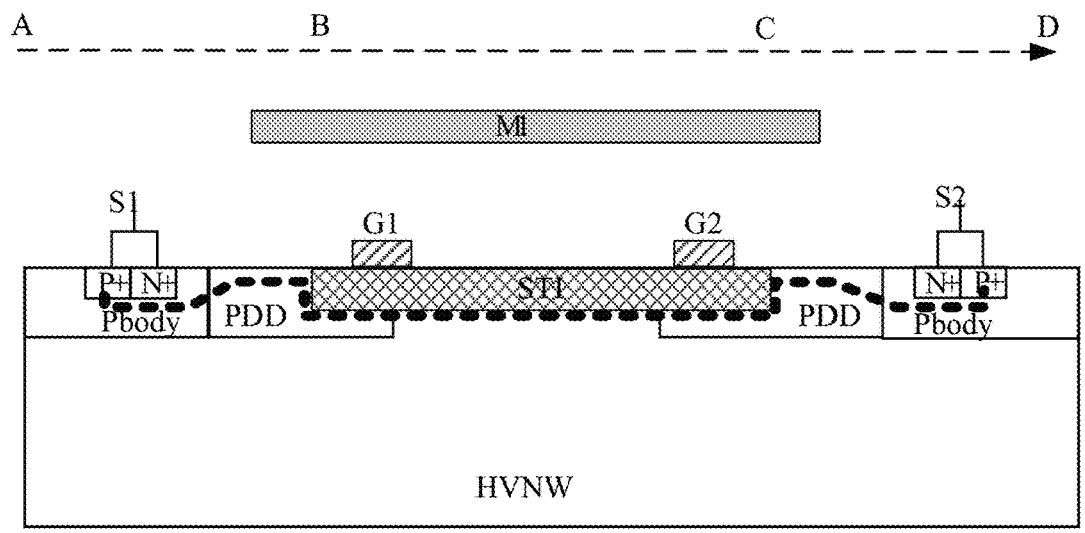
FIG. 3 is a second cross-sectional diagram at A-B-C-D of the example of FIG. 1.

Referring now to FIG. 1, shown is a layout diagram of an example bidirectional switching device. Referring also to FIG. 2, shown is a first cross-sectional diagram at A-B-C-D of the example of FIG. 1. Referring also to FIG. 3, shown is a second cross-sectional diagram at A-B-C-D of the example of FIG. 1. This example provides a bidirectional switch device and its terminal structure. During operation of the bidirectional switch device, a gate and a source of one side transistor may be short-circuited and connected to 0V, and a gate and a source of the other side transistor may be short-circuited and connected to a high potential. In FIG. 2, gate G1 and source S1 can be connected to a high potential, and gate G2 and source S2 may be short-circuited and connected to a zero potential. Here, parasitic diode PN1 composed of voltage-withstand doping region PDD (which can connect to the body Pbody of one side) at one side of the device and well region HVNW may be forward biased, and parasitic diode PN2 composed of voltage-withstand doping region PDD (which can connect to the body of the other side) at the other side of the device and well region HVNW may be reverse biased, and the device can deplete along the curve as shown.

When the voltage difference between the two sides is relatively large, the depletion region may extend to dotted line area X on one side, where the voltage is relatively high, while metal layer M1 can connect to gate G2, the voltage is the ground potential (e.g., 0V), and a voltage of well region HVNW can be positive. Thus, a reverse MOS capacitor structure may be formed by the gate, shallow trench isolation region located below the gate, and well region HVNW, whereby the surface of well region HVNW can be further depleted. As such, the existence of metal layer M1 may be more likely to make the surface of well region HVNW breakdown, and causing parasitic transistor (PDD-HVNW-PDD) electrical leakage, whereby the electrical leakage channel is shown in the dashed path in FIG. 3. In addition, the smaller the device size is, the smaller the base region width (HVNW) of the parasitic transistor is, and the higher the operating voltage of the high-voltage side device is, the base region can be easier to punch-through and abnormal electrical leakage more likely to occur.

Figure 4:
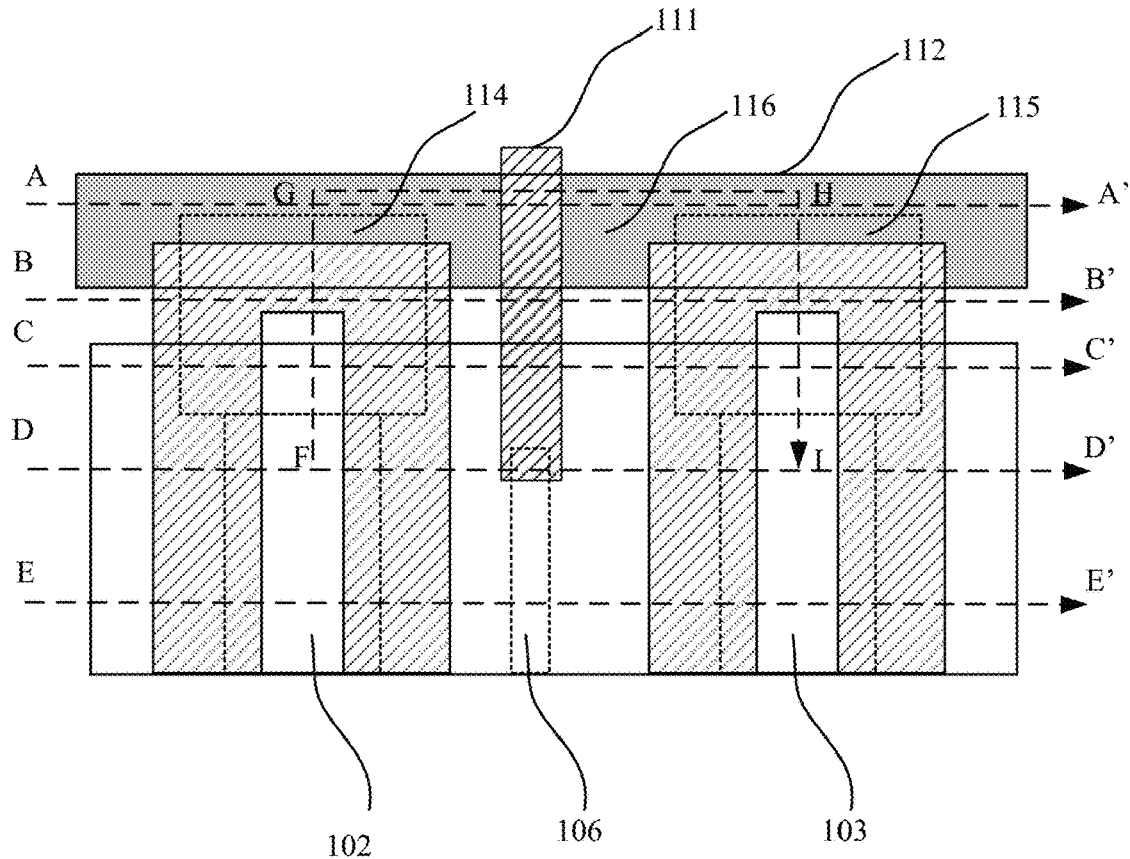
FIG. 4 is a layout diagram of an example bidirectional switch device, in accordance with embodiments of the present invention.
Figure 5:
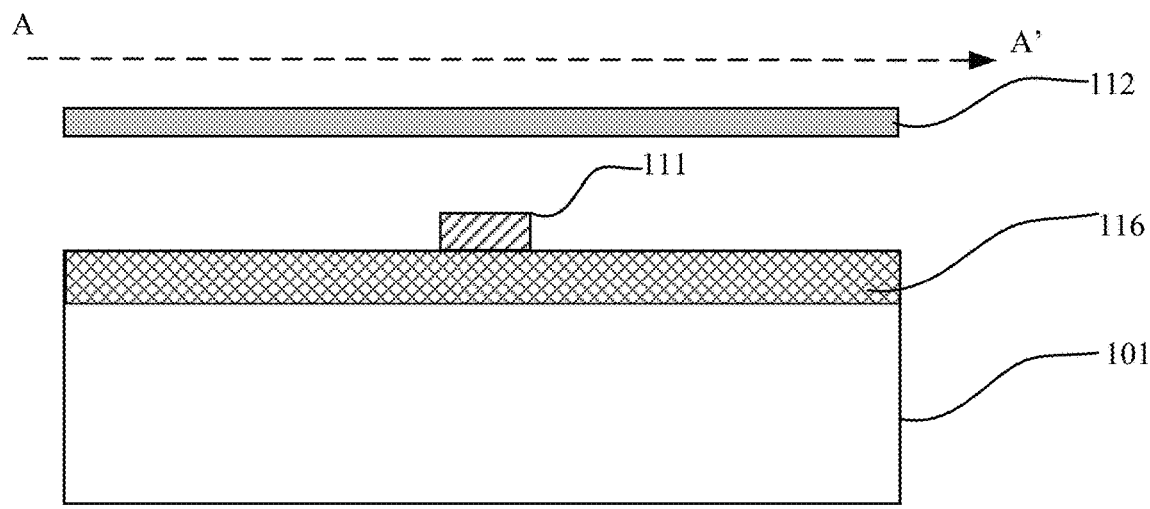
FIG. 5 is a cross-sectional diagram of the example of FIG. 4 at A-A', in accordance with embodiments of the present invention.
Figure 6:
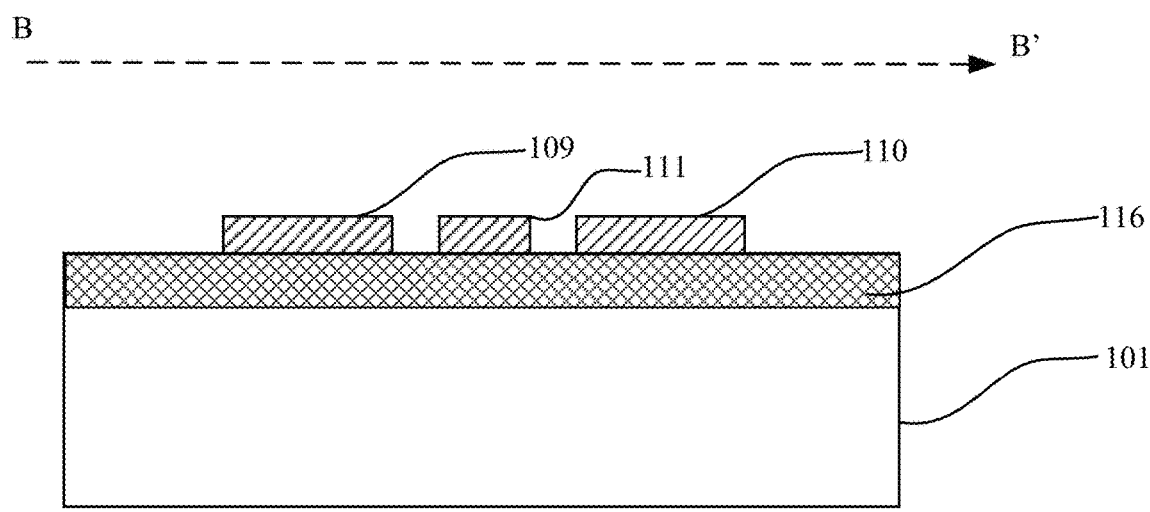
FIG. 6 is a cross-sectional diagram of the example of FIG. 4 at B-B', in accordance with embodiments of the present invention.
Figure 7:
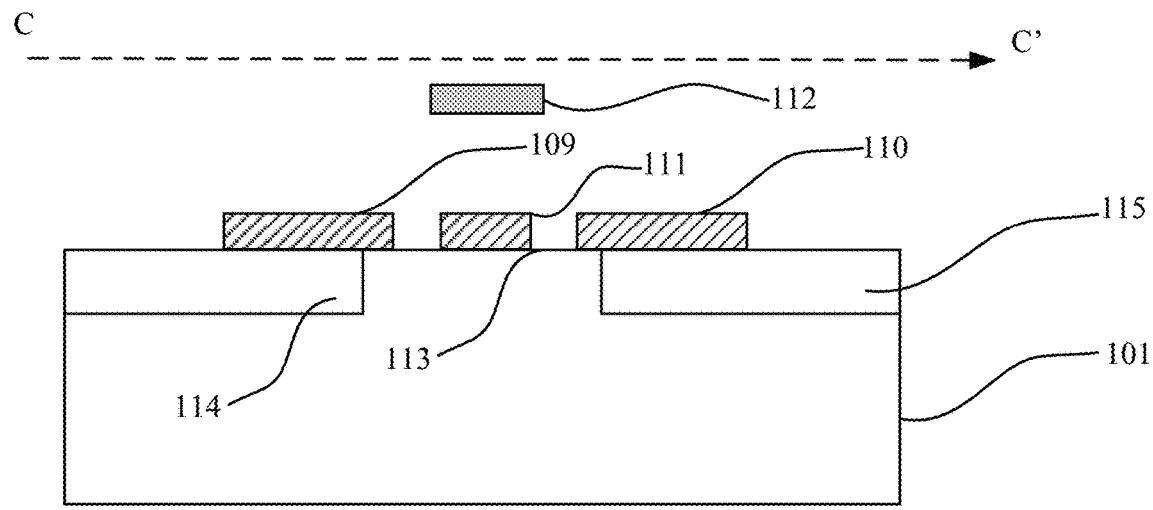
FIG. 7 is a cross-sectional diagram of the example of FIG. 4 at C-C', in accordance with embodiments of the present invention.
Figure 8:
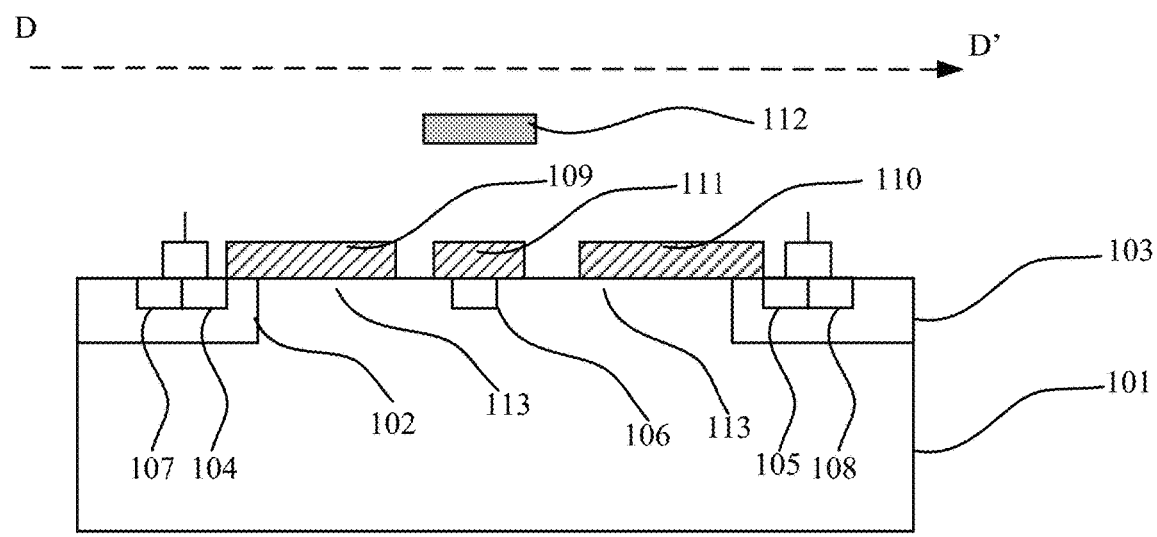
FIG. 8 is a cross-sectional diagram of the example of FIG. 4 at D-D', in accordance with embodiments of the present invention.
Figure 9:
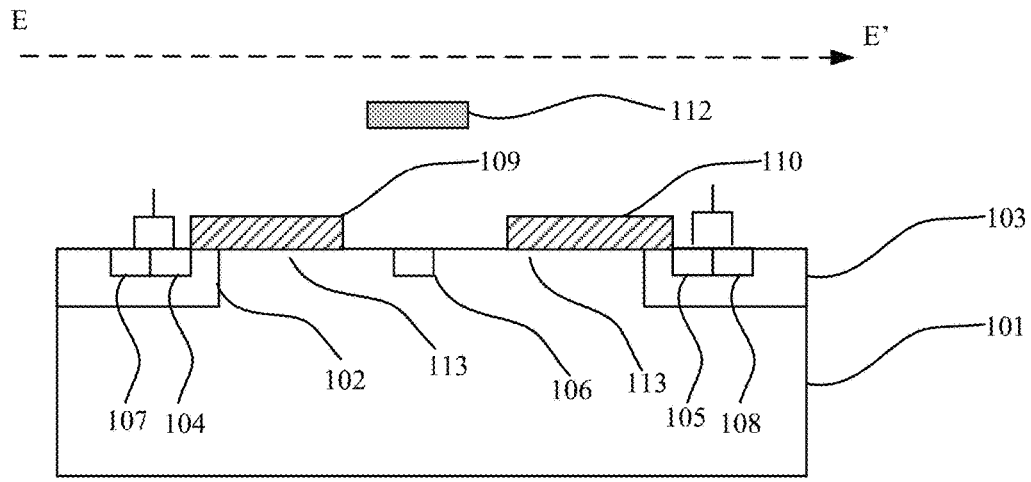
FIG. 9 is a cross-sectional diagram of the example of FIG. 4 at E-E', in accordance with embodiments of the present invention.
Figure 10:
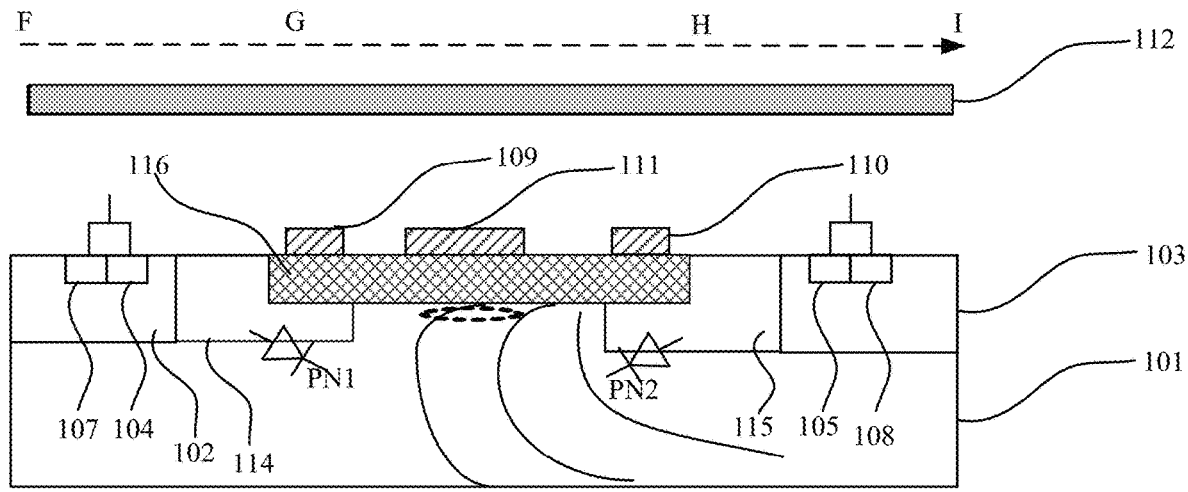
FIG. 10 is a cross-sectional diagram of the example of FIG. 4 at F-G-H-I, in accordance with embodiments of the present invention.

Referring now to FIG. 4, shown is a layout diagram of an example bidirectional switch device, in accordance with embodiments of the present invention. Referring also to FIG. 5, shown is a cross-sectional diagram of the example of FIG. 4 at A-A', in accordance with embodiments of the present invention. Referring also to FIG. 6, shown is a cross-sectional diagram of the example of FIG. 4 at B-B', in accordance with embodiments of the present invention. Referring also to FIG. 7, shown is a cross-sectional diagram of the example of FIG. 4 at C-C', in accordance with embodiments of the present invention. Referring also to FIG. 8, shown is a cross-sectional diagram of the example of FIG. 4 at D-D', in accordance with embodiments of the present invention. Referring also to FIG. 9, shown is a cross-sectional diagram of the example of FIG. 4 at E-E', in accordance with embodiments of the present invention. Referring also to FIG. 10, shown is a cross-sectional diagram of the example of FIG. 4 at F-G-H-I, in accordance with embodiments of the present invention. This example further provides a bidirectional switching device and its terminal structure.

The example terminal structure of a bidirectional switching device can include well region 101, and voltage-withstand regions 114 and 115 located in well region 101. Voltage-withstand region 114, well region 101, and voltage-withstand region 115 may form a parasitic transistor. The terminal structure can include a field plate located between voltage-withstand regions 114 and 115, and located on an upper surface of well region 101. The field plate can connect to a voltage to decrease the electrical leakage phenomenon of the parasitic transistor. For example, the field plate may be located on common drain 106. In this example, when the bidirectional switching device is in a withstand voltage state, that is, when the source and gate of one side transistor of the bidirectional switching device are connected to zero potential, and the source and gate of the other side transistor of the bidirectional switching device are connected to high potential, a first PN junction of the parasitic transistor can be biased forward, and a second PN junction may be biased reversed, a high potential connected to the field plate can decrease the electrical leakage phenomenon of the parasitic transistor.

Among them, in the direction perpendicular to the stacking of the bidirectional switching device, ends of field plate 111 can at least extend to edges of voltage-withstand regions 114 and 115, such that the vertical projection of the field plate divides the base region of the parasitic transistor. Further, in a direction perpendicular to the stacking of the bidirectional switching device, the ends of field plate 111 can extend beyond the edges of voltage-withstand regions 114 and 115 (e.g., as shown in FIG. 4, field plate 111 extends along the F→G and G→F directions beyond the edges of voltage-withstand regions 114 and 115), such that the vertical projection of field plate 111 divides the base region of the parasitic transistor. In one example, field plate 111 can be electrically connected to common drain 106, where common drain 106 is a common drain of both transistors, and the potential of field plate 111 varies with the voltage potential of common drain 106 of the bidirectional switching device.

Particular embodiments also provide a bidirectional switching device that can include well region 101 of a first conductive type, body region 102 of a second conductive type, body region 103 of the second conductive type, source region 104 of the first conductive type, source region 105 of the first conductive type, gates 109 and 110, voltage-withstand region 114 of the second conductive type, voltage-withstand region 115 of the second conductive type, trench isolation region 116, field plate 111, and metal wiring layer 112.

As shown in FIGS. 4-10, well region 101 of the first conductive type can be set in the substrate through ion doping processes, or directly as a whole substrate of the corresponding conductive type. The substrate material can include silicon. Of course, in other embodiments, the substrate material can also be germanium, germanium silicon, silicon carbide, III-V group compounds, etc. In one example, the substrate is an N-type conductive type, and the doped ions in the substrate can be, e.g., phosphorus.

As shown in FIGS. 4 and 8-10, body regions 102 and 103 of the second conductive type can be spaced and extend from the upper surface of well region 101 to inside of well region 101. In one embodiment, body regions 102 and 103 are P-type conductive types, and body regions 102 and 103 can be formed through processes such as ion implantation processes and annealing processes, with doped ions, such as boron.

As shown in FIGS. 4 and 8-10, source regions 104 and 105 of the first conductive type can respectively be arranged in body regions 102 and 103. In one embodiment, source regions 104 and 105 are N-type conductive types, and source regions 104 and 105 can be formed through processes, such as ion implantation processes and annealing processes, with doped ions such as phosphorus. Also, the ion doping concentration of source regions 104 and 105 can be greater than the ion doping concentration of well region 101.

As shown in FIGS. 4 and 8-10, the terminal structure can also include body contact region 107 of the second conductive type and body contact region 108 of the second conductive type. Body contact region 107 can be arranged in body region 102, and body contact region 108 can be arranged in body region 103. In one embodiment, body contact regions 107 and 108 are P-type conductive types, and body contact regions 107 and 108 can be formed through ion implantation processes and annealing processes. The doped ions of body contact regions 107 and 108, such as boron, may have an ion doping concentration greater than that of body regions 102 and 103. In one embodiment, body contact regions 107 and 108 can respectively be adjacent to source regions 104 and 105, in order to facilitate the leading out of body contact region 107 and source region 104 together through a metal silicide, and the leading out of body contact region 108 and source region 105 together through a metal silicide, making the device layout more compact. Body contact regions 107 and 108 can effectively reduce the contact resistance when body regions 102 and 103 are led out (e.g., for external connection), thereby reducing the power consumption of the device.

As shown in FIGS. 4, 8, and 10, common drain 106 of the first conductive type extend from an upper surface of well region 101 to an inside of well region 101 and may be located between body regions 102 and 103. In one embodiment, common drain 106 is an N-type conductive type, which can be formed through ion implantation processes and annealing processes. The doped ions of common drain 106, such as phosphorus, may have an ion doping concentration greater than the ion doping concentration of well region 101.

As shown in FIGS. 4, 6-10, 12, and 13, gate 109 can be arranged between source region 104 and common drain 106, and gate 110 may be arranged between source region 105 and common drain 106. Gates 109 and 110 can be located on the upper surface of well region 101. Gate 109 may be in contact with source region 104, and gate 110 can be in contact with source region 105. Gates 109 and 110 may both include a gate oxide layer and a polysilicon gate. The gate oxide layer can be formed through processes, such as thermal oxidation or plasma enhanced chemical vapor deposition (PECVD), low-pressure chemical vapor deposition (LPCVD), etc. The polysilicon gate can be formed through chemical vapor deposition (CVD), and gates 109 and 110 with the desired morphology can be formed through photolithography and etching processes.

As shown in FIGS. 4, 7, and 10, voltage-withstand regions 114 and 115 of the second conductive type may extend from the upper surface of well region 101 to inside of well region 101, respectively, and can be arranged at the ends of body regions 102 and 103. In one embodiment, voltage-withstand regions 114 and 115 are P-type conductive types, and voltage-withstand regions 114 and 115 can be formed through processes, such as ion implantation and annealing, with doped ions such as boron. In one embodiment, the width of voltage-withstand region 114 can be greater than the width of body region 102, and the width of voltage-withstand region 115 may be greater than the width of body region 103, in order to improve the voltage-withstand effect of voltage-withstand regions 114 and 115.

As shown in FIGS. 4-6 and 10, trench isolation region 116 (STI) can be located in well region 101 between voltage-withstand regions 114 and 115, and the depth of trench isolation region 116 may be less than the depth of voltage-withstand regions 114 and 115. Trench isolation region 116 can be set at the edge area of the terminal structure, and trench isolation region 116 can include a trench and insulating materials (e.g., silicon dioxide, etc.) filled in the trench.

As shown in FIGS. 4-8 and 10, field plate 111 can be arranged on the upper surface of well region 101, and further arranged on trench isolation region 116 between voltage-withstand regions 114 and 115. In addition, field plate 111 can be located on common drain 106 of the bidirectional switching device, and may be electrically connected to common drain 106.

As shown in FIG. 4, the end of field plate 111 can extend at least to the edges of voltage-withstand regions 114 and 115 in a direction perpendicular to the stacking of the bidirectional switching device, such that the vertical projection of field plate 111 divides the base region of the parasitic transistor. Further, in a direction perpendicular to the stacking of the bidirectional switching device, the ends of field plate 111 extends beyond the edges of voltage-withstand regions 114 and 115.

As shown in FIGS. 4-10, metal wiring layer 112 can cover voltage-withstand regions 114 and 115, as well as trench isolation region 116 between voltage-withstand regions 114 and 115. Field plate 111 may be arranged between metal wiring layer 112 and trench isolation region 116, and metal wiring layer 112 can be electrically connected to gate 110.

As shown in FIGS. 7 and 8, the terminal structure can also include field oxide layer 113, which may extend from trench isolation region 116 to the end of common drain 106. One end of field plate 111 can connect to common drain 106 and they extend from above field oxide layer 113 to trench isolation region 116. In one embodiment, field oxide layer 113 can also extend from both sides of common drain 106 to the edges of gates 109 and 110. The polysilicon gate electrodes of gates 109 and 110 may extend above field oxide layer 113 to trench isolation region 116. It should be noted that in FIGS. 7-9, only one example orientation of field oxide layer 113 is shown.

As shown in FIG. 10, when the first conductive type is an N-type conductive type and the second conductive type is a P-type conductive type, the bidirectional switch device and its terminal structure in this example can be subjected to withstand voltage, source region 105 and gate 110 can be short-circuited and connected to ground potential, and source region 104 and gate 109 may be short-circuited and connected to high potential. In this case, PN1 can be forward biased, PN2 may be reverse biased to the withstand voltage, and the expansion of the depletion line can be as shown by the curve in FIG. 10. The potential of common drain 106 and field plate 111 can increase with the increase of the potential of source region 104, and may be higher than the voltage of well region 101. The MOS capacitor structure with a forward bias may be formed between field plate 111 and well region 101 located below field plate 111 (e.g., as shown in the dashed box in FIG. 10), such that an electron accumulation region may be formed on the surface of well region 101. This can be equivalent to increasing the concentration of base region of the parasitic transistor, and may avoid depletion of well region 101 in order to prevent punch-through of the base region.

Although metal wiring layer 112 can remain at the ground potential, it still may have an accelerating depletion effect on the lower portion of well region 101. However, due to the added field plate 111 being between metal wiring layer 112 and well region 101, the effect of metal wiring layer 112 can be shielded. Therefore, the influence of metal wiring layer 112 on well region 101 can be substantially eliminated. In addition, the potential of field plate 111 during device conduction can be the same as the original potential of common drain 106, and as such may not affect the conduction characteristics of the device or change the intrinsic structure of the device. For example, field plate 111 can be made of polysilicon material, such that it can be formed simultaneously with gates 109 and 110 of the polysilicon gate, which is compatible with existing processes and without additional process flows.

Figure 11:
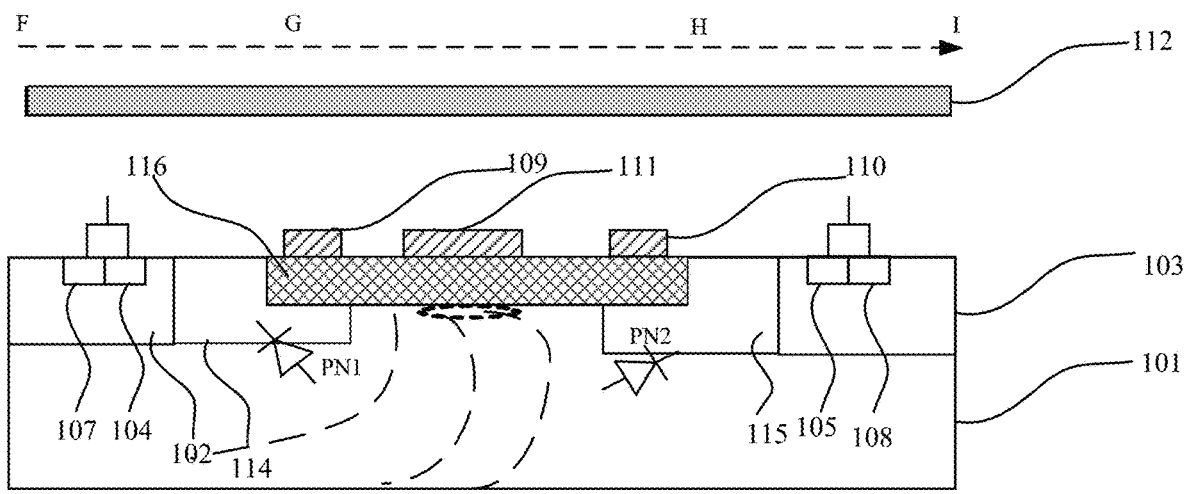
FIG. 11 is another cross-sectional diagram of the example of FIG. 5 at F-G-H-I, in accordance with embodiments of the present invention.

Referring now to FIG. 11, shown is another cross-sectional diagram of the example of FIG. 5 at F-G-H-I, in accordance with embodiments of the present invention. In this particular example, when the first conductive type is P-type conductive type and the second conductive type is N-type conductive type, the bidirectional switch device and its terminal structure can be subjected to the withstand voltage, source region 105 and gate 110 may be short-circuited and connected to a ground potential, and source region 104 and gate 109 can be short-circuited and connected to an high potential. Here, PN1 can be reverse biased to the withstand voltage, and PN2 may be forward biased, and the depletion line can thus extend as shown in the curve. The potential of common drain 106 and field plate 111 may remain a low potential and that is lower than the voltage of the well region 101. The MOS capacitor structure with reverse bias can be formed between field plate 111 and well region 101 located below field plate 111 (as shown in the dashed box in FIG. 10), such that a hole accumulation region may be formed on the surface of well region 101. This can be equivalent to increasing the concentration of base region of the parasitic transistor, thereby avoiding the depletion of well region 101 and preventing punch-through of base region 101. Here, although metal wiring layer 112 may remain at ground potential, it can still have an accelerating depletion effect on the lower portion of well region 101. However, due to the added field plate 111 being between metal wiring layer 112 and well region 101, the effect of metal wiring layer 112 can be shielded. Therefore, the influence of metal wiring layer 112 on well region 101 may be substantially eliminated.

Particular embodiments also provide an electronic device, which can include a bidirectional switching device as described herein. In one example, the electronic device can include one of mobile phones, laptops, tablets, intelligent robots, wearable electronic devices, and automotive electronic devices.

Figure 12:
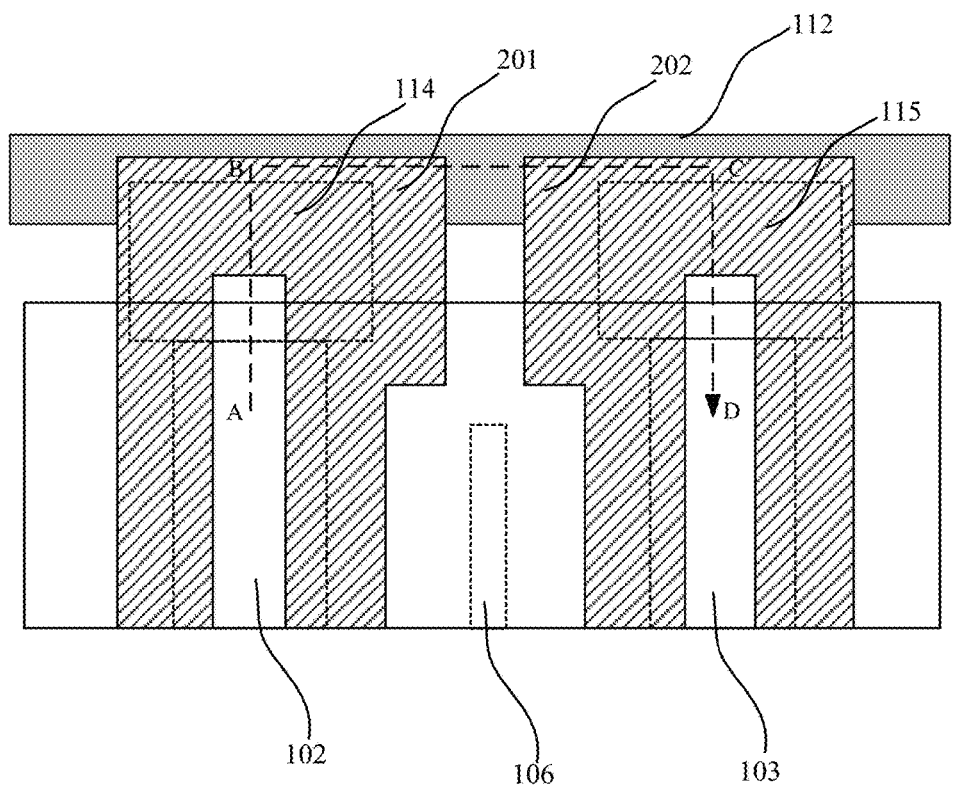
FIG. 12 is a layout diagram of another example bidirectional switch device, in accordance with embodiments of the present invention.
Figure 13:
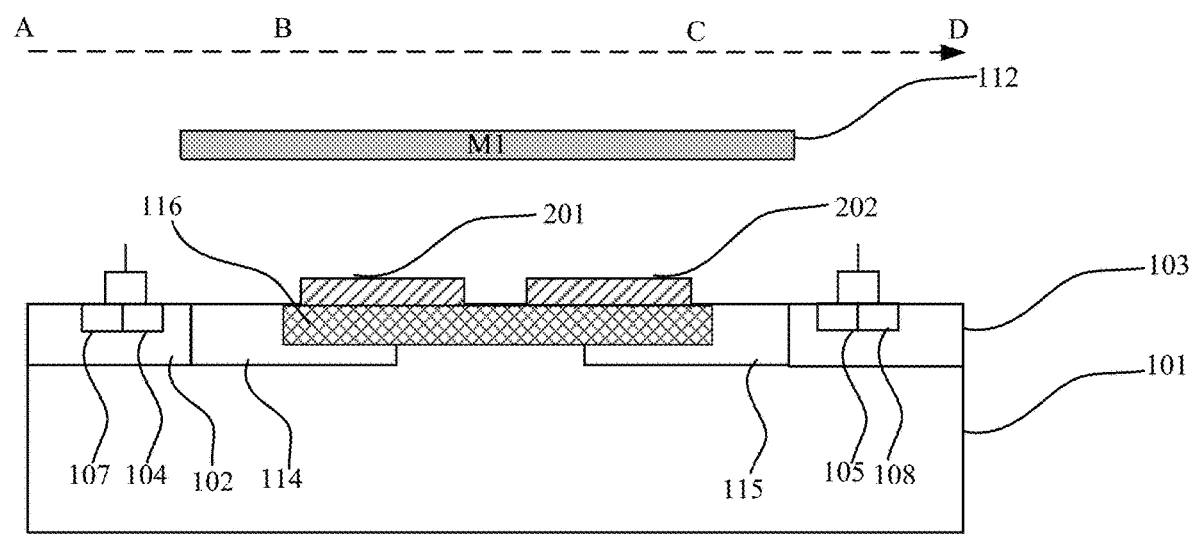
FIG. 13 is a cross-sectional diagram at A-B-C-D of the example of FIG. 12, in accordance with embodiments of the present invention.

Referring now to FIG. 12, shown is a layout diagram of another example bidirectional switch device, in accordance with embodiments of the present invention. Referring also to FIG. 13, shown is a cross-sectional diagram at A-B-C-D of the example of FIG. 12, in accordance with embodiments of the present invention. This particular example terminal structure of a bidirectional switching device can include field plates 201 and 202, where common drain 106 of bidirectional switch device may be located between the gates of the two side transistors of the bidirectional switch device. Field plates 201 and 202 can respectively extend from the gates of the two side transistors to the direction of common drain 106. In the direction perpendicular to the stacking of the bidirectional switch device, the ends of field plates 201 and 202 may extend beyond the edge or to the edge of voltage-withstand regions 114 and 115, such that the base region of the parasitic transistor composed of voltage-withstand region 114, the well region 101 located between voltage-withstand regions 114 and 115, and voltage-withstand region 115 is divided by the vertical projection of field plates 201 and 202. The voltage of field plates 201 and 202 can vary with the gate voltage of the transistors on both sides, thereby decreasing the electrical leakage of parasitic transistors. In one embodiment, field plates 201 and 202 may respectively be integrated with gates 109 and 110 of the transistors on both sides. The potential of field plates 201 and 202 can vary with the potential changes of gates 109 and 110 on both sides of the transistors. The MOS capacitor structure can be formed by field plates 201 and 202 and well region 101 below them, which may form an accumulation region on the surface of well region 101 and avoid the depletion of well region 101 and the occurrence of electrical leakage.

Particular embodiments may also provide a bidirectional switching device that can include well region 101 of the first conductive type, body region 102 of a second conductive type, body region 103 of the second conductive type, source region 104 of the first conductive type and source region 105 of the first conductive type, gates 109 and 110, voltage-withstand region 114 of the second conductive type, voltage-withstand region 115 of the second conductive type, trench isolation region 116, field plate 201, field plate 202, and metal wiring layer 112. As shown in FIGS. 12 and 13, well region 101 of the first conductive type can be set in the substrate through ion doping processes or directly as a whole substrate of the corresponding conductive type. The substrate material can include silicon. Of course, in other examples, the substrate material can also be germanium, germanium silicon, silicon carbide, III-V group compounds, etc. In one embodiment, the substrate is an N-type conductive type, and the doped ions in the substrate can be, e.g., phosphorus.

As shown in FIGS. 12 and 13, body regions 102 and 103 of the second conductive type can be spaced and may extend from the upper surface of well region 101 to inside of well region 101. In one embodiment, body regions 102 and 103 are P-type conductive types, and body regions 102 and 103 can be formed through processes, such as ion implantation processes and annealing processes, with doped ions such as boron. Source regions 104 and 105 of the first conductive type may respectively be arranged in body regions 102 and 103. In one embodiment, source regions 104 and 105 are N-type conductive types, and source regions 104 and 105 can be formed through processes, such as ion implantation processes and annealing processes, with doped ions such as phosphorus. Also, the ion doping concentration of source regions 104 and 105 can be greater than the ion doping concentration of well region 101.

The terminal structure can also include body contact region 107 of the second conductive type and body contact region 108 of the second conductive type. Body contact region 107 can be arranged in body region 102, and body contact region 108 may be arranged in body region 103. In one embodiment, body contact regions 107 and 108 are P-type conductive types, and body contact regions 107 and 108 can be formed through ion implantation processes and annealing processes. The doped ions of body contact regions 107 and 108 (e.g., boron) may have an ion doping concentration greater than that of body regions 102 and 103. In one embodiment, body contact regions 107 and 108 may respectively be adjacent to source regions 104 and 105, in order to facilitate leading out of body contact region 107 and source region 104 together through a metal silicide, and leading out of body contact region 108 and source region 105 together through a metal silicide, thus making the device layout more compact. Body contact regions 107 and 108 can effectively reduce the contact resistance when body regions 102 and 103 are led out, thereby reducing the power consumption of the device.

Common drain 106 of the first conductive type may be located between body regions 102 and 103. In one embodiment, common drain 106 is an N-type conductive type, which can be formed through ion implantation processes and annealing processes. The doped ions of common drain 106 (e.g., phosphorus) may have an ion doping concentration greater than the ion doping concentration of well region 101. Gate 109 can be arranged between source region 104 and common drain 106, and gate 110 may be arranged between source region 105 and common drain 106. Gates 109 and 110 can both include a gate oxide layer and a polysilicon gate. The gate oxide layer can be formed through processes such as thermal oxidation or plasma enhanced chemical vapor deposition (PECVD), low-pressure chemical vapor deposition (LPCVD), etc. The polysilicon gate can be formed through chemical vapor deposition (CVD), and gates 109 and 110 with the desired morphology can be formed through photolithography and etching processes.

Voltage-withstand regions 114 and 115 of the second conductive type can be arranged at the end of body region 102 and the end of body region 103, respectively. In one embodiment, voltage-withstand regions 114 and 115 are P-type conductive types, and voltage-withstand regions 114 and 115 can be formed through processes, such as ion implantation and annealing, with doped ions such as boron. In one embodiment, the width of voltage-withstand region 114 can be greater than the width of body region 102, and the width of voltage-withstand region 115 can be greater than the width of body region 103, in order to improve the voltage-withstand effect of voltage-withstand regions 114 and 115.

Trench isolation region 116 (STI) can be located in well region 101 between voltage-withstand regions 114 and 115, and the depth of trench isolation region 116 may be less than the depth of voltage-withstand regions 114 and 115. Trench isolation region 116 can be set at the edge area of the terminal structure, and trench isolation region 116 can include a trench and insulating materials (e.g., silicon dioxide, etc.) filled in the trench.

Common drain 106 of the bidirectional switch device may be located between the gates of the two side transistors of the bidirectional switch device. Field plates 201 and 202 can extend from the gates of the two side transistors to the direction of common drain 106, respectively. One end of field plates 201 may extend beyond the edges or to the edges of voltage-withstand region 114 and one end of field plates 202 may extend beyond the edges or to the edges of voltage-withstand region 115 (as shown in FIG. 12, field plates 201 and 202 extend along the directions A→B and B→A to the edges of voltage-withstand regions 114 and 115), such that the vertical projection of field plates 201 and 202 divide the base region of the transistor composed of voltage-withstand region 114, well region 101, and voltage-withstand region 115. Field plate 201 and gate 109 can connect to the same potential, and field plate 202 and gate 110 can connect to the same potential.

When the bidirectional switch device and its terminal structure are subjected to the withstand voltage, and the first conductive type is an N-type conductive type and the second conductive type is a P-type conductive type, source region 105 and gate 110 can be short-circuited and connected to ground potential, and source region 104 and gate 109 may be short-circuited and connected to high potential. The potential of field plate 201 can be the same as that of gate 109, and may be higher than the voltage of well region 101. The MOS capacitor structure with a forward bias can be formed between field plate 201 and well region 101 located below field plate 201, such that an electron accumulation region is formed on the surface of well region 101. This can be equivalent to increasing the concentration of base region of the parasitic transistor and avoids depletion of well region 101, in order to prevent punch-through of the base region.

In another example, when the first conductive type is P-type conductive type and the second conductive type is N-type conductive type, the bidirectional switch device and its terminal structure can be subjected to the withstand voltage, source region 105 and gate 110 can be short-circuited and connected to a ground potential, and source region 104 and gate 109 may be short-circuited and connected to a high potential. The potential of field plate 202 may remain low potential and can be lower than the voltage of well region 101. The MOS capacitor structure with reverse bias can be formed between field plate 202 and well region 101 located below field plate 202, such that a hole accumulation region may be formed on the surface of well region 101. This can be equivalent to increasing the concentration of base region of the parasitic transistor, thereby avoiding the depletion of well region 101 and preventing punch-through of the base region 101.

Although metal wiring layer 112 may remain connected to gate 110 at zero potential, due to the added field plate 111 being between metal wiring layer 112 and well region 101, the effect of metal wiring layer 112 can be shielded. Therefore, the influence of metal wiring layer 112 on well region 101 can be substantially eliminated. Further, field plates 201 and 202 may be formed by extending from the polysilicon of gates 109 and 110 to trench isolation region 116 between voltage-withstand regions 114 and 115, respectively. In this approach, field plates 201 and 202 can be formed at substantially the same time with the polysilicon gates, which can effectively prevent the base region of the parasitic transistor of the terminal structure of the bidirectional switching device from punch-through leakage, and may effectively reduce manufacturing costs of the device.

Particular embodiments provide a terminal structure and a bidirectional switching device, where the field board is arranged in a trench isolation region between first and second voltage-withstand regions. The voltage of the field board can change with the gate voltage of the transistors on both sides, and the MOS structure may be formed by the field plate and the well region below the field plate, such that an accumulation region can be formed on the surface of the well region, and the equivalent concentration of the base region may be increased to avoid depletion of the well region. Therefore, the base region of parasitic transistors in the terminal structure of bidirectional switching devices can be prevented from punch-through leakage. In addition, when the device is turned on, the added field plate may not change the potential of each electrode, and as such may not affect the conduction characteristics of the device or change the intrinsic structure of the device. This approach can form the field board and the polysilicon gate simultaneously, effectively preventing the parasitic transistor base region of the bidirectional switching device terminal structure from punch-through and leakage, while effectively reducing manufacturing costs of the device.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A terminal structure of a bidirectional switching device, the terminal structure comprising:

a) a field plate located on a top surface of a well region and between a first voltage-withstand region and a second voltage-withstand region, wherein the bidirectional switching device comprises the well region, and the first and second voltage-withstand regions located in the well region; and b) wherein a potential is connected to the field plate, in order to decrease an electrical leakage of a parasitic transistor, wherein the parasitic transistor is formed by the first voltage-withstand region, the well region, and the second voltage-withstand region.

2. The terminal structure of claim 1, wherein in a direction perpendicular to stacking of the bidirectional switching device, ends of the field plate extend at least to edges of the first voltage-withstand region and the second voltage-withstand region to divide a base region of the parasitic transistor by vertical projection of the field plate.

3. The terminal structure of claim 1, wherein in a direction perpendicular to stacking of the bidirectional switching device, ends of the field plate extend beyond edges of the first voltage-withstand region and the second voltage-withstand region.

4. The terminal structure of claim 1, wherein the field plate is located on a common drain of the bidirectional switching device.

5. The terminal structure of claim 4, wherein the field plate is electrically connected to the common drain of the bidirectional switching device.

6. The terminal structure of claim 1, wherein the field plate comprises a first field plate and a second field plate respectively and integrally formed with gates of transistors at two sides of the bidirectional switching device.

7. The terminal structure of claim 5, wherein the common drain of the bidirectional switching device is located between gates of transistors on both sides of the bidirectional switching device, and the first field plate and the second field plate extend along a direction from the gates of the transistors on both sides to the common drain.

8. The terminal structure of claim 5, wherein a potential of the field plate varies with a potential of the common drain of the bidirectional switching device, or with a gate voltage of the transistors on both sides.

9. The terminal structure of claim 1, wherein the field plate comprises polysilicon.

10. A bidirectional switching device, comprising:

a) a well region of a first conductive type;
    b) a first body region and a second body region of a second conductive type and extending from an upper surface of the well region to inside the well region;
    c) a first source region of the first conductive type arranged in the first body region, and a second source region of the first conductive type arranged in the second body region;
    d) a common drain of the first conductive type extending from the upper surface of the well region to inside of the well region, and arranged between the first body region and the second body region;
    e) a first gate and a second gate located on an upper surface of the well region, wherein the first gate is arranged in a first source region and the common drain, the second gate is arranged in a second source region and the common drain;
    f) a first voltage-withstand region of the second conductive type and being in contact with the first body region, and a second voltage-withstand region of the second conductive type and being in contact with the second body region;

g) a field plate located on the upper surface of the well region and located between the first voltage-withstand region and the second voltage-withstand region; and h) wherein a potential is connected to the field plate, in order to decrease an electrical leakage of a parasitic transistor.

11. The bidirectional switching device of claim 10, wherein in a direction perpendicular to stacking of the bidirectional switching device, ends of the field plate extend at least to edges of the first voltage-withstand region and the second voltage-withstand region to divide the base region of the parasitic transistor by vertical projection of the field plate.

12. The bidirectional switching device of claim 10, wherein in a direction perpendicular to stacking of the bidirectional switching device, ends of the field plate extend beyond edges of the first voltage-withstand region and the second voltage-withstand region.

13. The bidirectional switching device of claim 10, wherein the field plate is located on the common drain of the bidirectional switching device.

14. The bidirectional switching device of claim 13, wherein the field plate is electrically connected to the common drain of the bidirectional switching device.

15. The bidirectional switching device of claim 10, further comprising a trench isolation region located in the well region between the first voltage-withstand region and the second voltage-withstand region.

16. The bidirectional switching device of claim 15, further comprising a metal wiring layer covering the first voltage-withstand region and second voltage-withstand region and the trench isolation region, wherein the field plate is arranged between the metal wiring layer and the trench isolation region, and the metal wiring layer is electrically connected to the first gate or the second gate.

17. The bidirectional switching device of claim 15, wherein the field plate comprises a first field plate and a second field plate, the first field plate being formed by extending from the first gate to the trench isolation region, and the second field plate being formed by extending from the second gate to the trench isolation region.

18. The bidirectional switching device of claim 17, wherein the first field plate and the first gate are connected to a first potential, and the second field plate and the second gate are connected to a second potential.

19. The bidirectional switching device of claim 10, further comprising a first body contact region and a second body contact region of the second conductive type, wherein the first body contact region is arranged in the first body region, and the second body contact region is arranged in the second body region.

20. An electronic device, comprising the bidirectional switching device of claim 10, wherein the electronic device comprises one of mobile phones, laptops, tablets, intelligent robots, wearable electronic devices, and automotive electronic devices.

\* \* \* \* \*